United States Patent [19]
Nakashiba

[11] Patent Number: 6,011,282
[45] Date of Patent: Jan. 4, 2000

[54] CHARGE COUPLED DEVICE WITH A BURIED CHANNEL TWO-PHASE DRIVEN TWO-LAYER ELECTRODE STRUCTURE

[75] Inventor: Yasutaka Nakashiba, Tokyo, Japan

[73] Assignee: NEC Corporation, Tokyo, Japan

[21] Appl. No.: 08/975,187

[22] Filed: Nov. 20, 1997

[30] Foreign Application Priority Data

Nov. 28, 1996 [JP] Japan ..................................... 8-317597

[51] Int. Cl.[7] .................. H01L 27/148; H01L 29/768
[52] U.S. Cl. ........................ 257/221; 257/246; 257/250
[58] Field of Search ................... 257/221, 249, 257/250, 218, 219, 246

[56] References Cited

U.S. PATENT DOCUMENTS

| 3,927,468 | 12/1975 | Anthony et al. . | |
| 4,231,810 | 11/1980 | Juntsch et al. . | |
| 5,227,680 | 7/1993 | Nogucho et al. | 257/239 |

FOREIGN PATENT DOCUMENTS

| 62-71273 | 4/1987 | Japan . |
| 4-65133 | 3/1992 | Japan . |
| 4-360578 | 12/1992 | Japan . |
| 6-291148 | 10/1994 | Japan . |

OTHER PUBLICATIONS

Choong–Ki Kim, "Two–Phase Charge Coupled Linear Imaging Devices with Self–Aligned Implanted Barrier", *IEDM Technical Digest*, 1974, pp. 55–58.

*Primary Examiner*—Ngân V. Ngô
*Attorney, Agent, or Firm*—Sughrue, Mion, Zinn, Macpeak & Seas, PLLC

[57] ABSTRACT

A charge coupled device of buried channel type suitable to drive the device by clock pluses having a low voltage is disclosed. Channels of the charge coupled device comprises first to third regions. The first region has a first impurity concentration. The second region has a second impurity concentration lower than the first impurity concentration. The third region has a third impurity concentration lower than the second impurity concentration. A first transfer electrode is formed on the first region. A second transfer electrode is formed on the second region.

7 Claims, 5 Drawing Sheets

POTENTIAL

POTENTIAL

CHARGE COUPLED DEVICE WITH A BURIED CHANNEL TWO-PHASE DRIVEN TWO-LAYER ELECTRODE STRUCTURE

BACKGROUND OF THE INVENTION

1. Field of the Invention

The present invention relates to a charge coupled device, and more particularly, to a charge coupled device driven by a two-phase clock pulse applying to two-layer electrodes, which having a charge storage region and a charge barrier region which are self-aligningly formed in a charge transfer electrode.

2. Description of the Prior Art

In recent years, development is eagerly performed for an image capture device with a large number of pixels, and high portability such as a video camera for high definition TV and a digital still camera. Such image capture device requires development of a solid imaging device with low power consumption. To reduce power consumption, it is important to lower a drive voltage for a horizontal charge transfer section of an image capture device. It is because the horizontal charge transfer section is necessary to transfer signal charges at a high speed. Consequently, the horizontal charge transfer section usually employs two-layer electrodes supplied with a two-phase clock signal.

Such charge transfer device is described in IEDM Technical Digest, 1974, pp. 55–58, or Japanese Patent Application Laid-Open No. sho 62-71273.

FIGS. 3(a)–(g) sequentially shows sectional views in each manufacturing step of a charge coupled device with a conventional buried channel, two-phase driven two-layer electrode structure. Referring to FIGS. 3(a)–(g), the fabricating process is described for a conventional charge coupled device. First, an n-type silicon region 2 with impurity concentration of $1 \times 10^{17} cm^{-3}$ and a depth of 0.5 μm from the surface of a silicon substrate 1 is formed in a p-type monocrystalline silicon substrate 1 with impurity concentration of $1 \times 10^{15} cm^3$. Subsequently, a first silicon oxide film 3 with a thickness of 100 nm on the surface of the n-type silicon region 2 is formed by a thermal oxidation technique (FIG.3(a)).

Then, a polycrystal silicon layer is formed in a thickness of 300 nm on an entire surface of the first silicon oxide film 3 with a low-pressure CVD (LPCVD) process, and patterned it to form a first conductive electrodes 4 (FIG.3(b)).

Then, after the first silicon oxide film 3 is removed by using the first conductive electrodes 4 as mask, a second silicon oxide film 6 with a thickness of 100 nm is formed on the surface of the n-type silicon region 2 and the surface of the first conductive electrodes 4 by the CVD process (FIG.3(c)).

Subsequently, p-type impurities, such as boron, is implanted into the n-type silicon region 2 through the second silicon oxide film 6 using the first conductive electrodes 4 as a mask to form $n^{--}$ type silicon regions 7 with impurity concentration of $8 \times 10^{16} cm^3$ and self-aligning with the first conductive electrodes 4 and the second silicon oxide film 6 on its side wall (FIG.3(d)).

Then, after a polycrystalline layer with a thickness of 300 nm is formed on an entire surface of the second silicon oxide film 6 by the LPCVD process, and patterned to form a second conductive electrodes 8 (FIG.3(e)). Then, an inter-layer dielectric film 9 is formed (FIG.3(f)).

Thereafter, metal wiring are formed on the inter-layer dielectric film 9 supplying the first conductive electrodes 4 and the second conductive electrodes 8 with a two-phase clock signal (FIG.3(g)). Then, a conventional two-phase driven two-layer electrode charge coupled device is obtained.

According to the conventional two-phase driven two-layer electrode charge coupled device, each of the n-type silicon regions 2 has the same impurity concentration $(1 \times 10^{17} cm^3)$ between just below the first charge transfer electrodes 4 and in the gap between the first charge transfer electrodes 4 and the second charge transfer electrodes 8, i.e., just below the second silicon oxide film 6 formed on the side wall of the first charge transfer electrodes 4. This is because the n-type silicon regions 2 is covered with the first charge transfer electrodes 4 and the second silicon oxide film 6 on the side wall of the first charge transfer electrodes 4 during the ion implantation to form the n-type silicon regions 7.

Here, the thickness of the silicon oxide film below each electrode is considered to estimate electric potential in transferring charges. It is 100 nm (thickness of the first silicon oxide film 3) just below the first charge transfer electrodes 4. It is also 100 nm (thickness of the second silicon oxide film 6) just below the recess of the second charge transfer electrodes 8. On the other hand, the silicon film is substantially very thick in the gap between the first charge transfer electrode 4 and the second charge transfer electrodes 9, i.e., on the side wall of the first charge transfer electrodes 4. In the example described above, the thickness of the silicon oxide film on the side wall of the first charge transfer electrode 4 is substantially equal to sum of the first silicon oxide film 3 (100 nm), the first charge transfer electrodes 4 (300 nm), and the second silicon oxide film 6 (100 nm). Consequently, when it is intended to transfer signal charges at a low drive voltage of, for example, 3V, a problem that the electrical potential is depressed at the gap between both the electrodes arises, thereby the transfer efficiency being deteriorated. The effect of the it will be described as followings.

FIG.4(b) is diagram of an electrical potential to explain the deterioration of the transfer efficiency occurring when the drive voltage is lowered in the conventional charge coupled device of the two-layer electrode two-phase driven system the sectional view of which is shown in FIG.4(a). According to FIG.4(b) a broken line shows the electrical potential when the drive voltage is relatively high voltage, for example, at 5V, while a solid lines shows the electrical potential when the drive voltage is relatively low voltage, for example, at 3V. When there is larger electric potential difference between the adjacent charge transfer electrodes, the depression of electrical potential generated from the gap between the first charge transfer electrodes 4 and the second charge transfer electrodes 8 is more modulated by a fringing electric field so that the depression of electrical potential is suppressed as shown by broken line in FIG.4(b). That is, as shown in FIG.4(b), if the driving voltage is sufficiently high for the charge transfer device, and there is sufficiently high electric potential difference $\phi_2$ ($\phi_{21}$, $\phi_{22}$), there occurs no depression in the electric potential, so that signal charges are smoothly transferred.

On the other hand, if the potential difference becomes small between the first charge transfer electrodes 4 and the second charge transfer electrodes 8 which are adjacent, then the depression tends to occur in the electric potential, thereby defective transfer being caused. That is, as shown by the solid lines in FIG.4(b), if the driving voltage is relatively low for the charge coupled device, and there is a small electric potential difference $\phi_1$ ($\phi_{11}$, $\phi_{12}$), become small the potential difference $\phi_{11}$ between the first charge transfer electrodes 4 and the second charge transfer electrodes 8 to which different voltage is applied, and the potential difference $\phi_{12}$ between the first charge transfer electrodes 4 and the second charge transfer electrodes 8 to which equal voltage is applied. Consequently, depressions of electric potential indicated by points A and B below the gap between the first charge transfer electrode 4 and the second charge transfer electrode 8 is occurred, because the fringing electric field is weak so that the electrical potential is not suppressed sufficiently.

When such depression occurs, not only the signal charge is trapped in the depression, but also the charge transfer field becomes weak near the depression of electric potential. Thus, the signal charge is dominantly transferred by thermal diffusion. As the result, the transfer time becomes very long, so that it becomes difficult to perform transfer at a high speed, and defective transfer tends to occur. From the above, it is found to transfer charges at a high speed even when the drive voltage for a charge transfer device is reduced that the charge transfer device is important to be constructed in such a manner that the depression in electric potential can be suppressed.

SUMMARY OF THE INVENTION

It is therefore an object of the present invention to provide an improved charge coupled device.

It is another object of the present invention to provide a charge coupled device of a two-layer electrode two-phase driven system which transfers signal charge at high speed even a voltage of a clock signal is relatively low.

It is still another object of the present invention to provide a charge coupled device of a two-layer electrode two-phase driven system which transfers signal charge without defect even a voltage of a clock signal is relatively low.

A charge coupled device according to the present invention comprises a semiconductor substrate of a first conductivity type, a first region of a second conductivity type having a first impurity concentration formed in said semiconductor substrate, a second region of said second conductivity type having a second impurity concentration formed in said semiconductor substrate, a third region of said second conductivity type having a third impurity concentration, which is lower than each of said first and second impurity concentration, formed in said semiconductor substrate, said third region intervening between said first and second regions, a first transfer electrode formed on said first region of said semiconductor substrate, a second transfer electrode formed on said second region of said semiconductor substrate, a first dielectric film intervening between said first region of said semiconductor substrate and said first transfer electrode, a second dielectric film intervening between said second region of said semiconductor substrate and said second transfer electrode, and a third dielectric film intervening between said first and second transfer electrodes.

According to the present invention, thus, signal charges cannot be trapped in depression even when the drive voltage is lowered, so that smooth transfer can be attained.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1A:
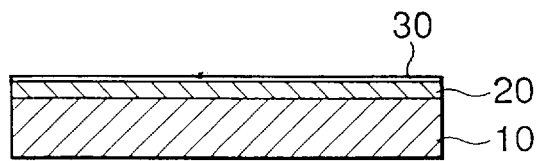
FIGS.1(a)–(g) are sequential sectional views of fabricating steps of a charge coupled device according to a first embodiment of the present invention.
Figure 1B:
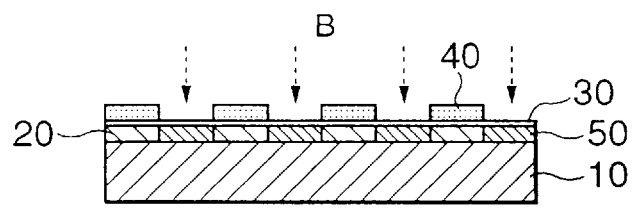
Figure 1C:
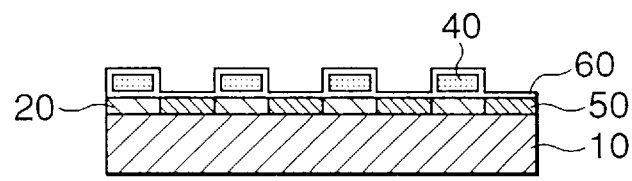

Now, an embodiment of the present invention will be explained with reference to the drawings.

FIGS.1(a)–(g) sequentially shows sectional views in each fabricating step of a charge coupled device with a buried channel two-phase driven two-layer electrode structure according to a first embodiment of the present invention.

First, a n-type silicon region 20 with impurity concentration of about $1\times10^{17}cm^3$ is formed into a p-type silicon monocrystalline substrate 10 with impurity concentration of about $1\times10^{15}cm^3$. A depth of the n-type silicon region 20 is about 0.5 µm from the surface of the silicon substrate 10. The n-type silicon region 20 is formed by ion implantation technique implanting phosphorus into the p-type silicon substrate 10. Thereafter, a first silicon oxide film 30 with a thickness of about 100 nm is formed on the surface of the n-type silicon region 20 by a thermal oxidation technique (FIG.1(a)).

It is noted that each of forming method or condition of the n-type silicon region 20 and the first silicon oxide film 30 is not limited to aforementioned technique or condition.

Then, using the low pressure CVD (LPCVD) process, a polycrystalline silicon layer with a thickness of about 300 nm is formed on an entire surface of the first silicon oxide layer 30, and thereafter, the polycrystalline silicon layer is patterned to form a first conductive electrode 40. Then, p-type impurities (for example, boron) of the conductivity opposite is implanted into the n-type silicon region 20 through the first silicon oxide film 30 using the first conductive electrode 40 as a mask to form an n-type silicon region 50 in the n-type silicon region 20 self-aligning with the first conductive electrode 40 (FIG.1(b)). The ion implantation is performed at a condition of an incident angle of zero. An impurity concentration of the n-type silicon region 50 is about $6\times10^{16}cm^3$.

Subsequently, after the first silicon oxide film 30 is removed by using the first conductive electrode 40 as a mask because the first silicon oxide film 30 was damaged by the previous ion implantation. Then, a second silicon oxide film 60 with a thickness of about 100 nm is formed on the surface of the n-type silicon region 20 and the surface of the first conductive electrode 40 by, for example, reacting $SiH_4$ and $H_2O$ gas with the CVD process (FIG.1(c)).

Figure 1D:
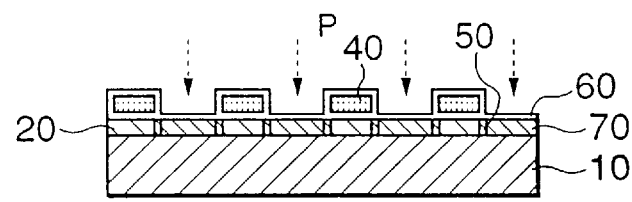
Figure 1E:
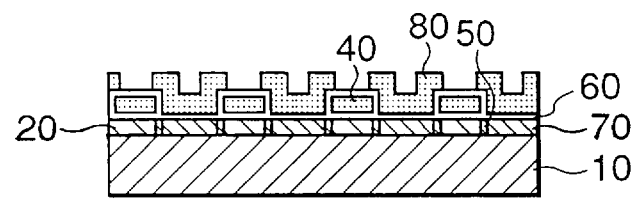
Figure 1F:
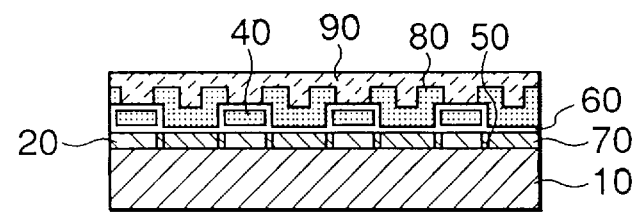

Then, n-type impurities (for example, phosphorus) of the same conductivity as the n-type semiconductor region 20 is implanted into the n-type silicon region 50 through the second silicon oxide film 60 using the first conductive electrode 40 and a part of the second dielectric film 60 formed on the side wall of the first conductive electrode 40 as a mask to form an n-type silicon region 70 in the n-type silicon region 50 self-aligning with the first conductive electrode 40 and the part of the second dielectric film 60 (FIG.1(d)). The ion implantation is performed at a condition of an incident angle of zero. An impurity concentration of the n-type silicon region 70 is about $8\times10^{16} cm^3$.

Apparent from FIG.1(d), the n-type silicon region 50 remains only below the part of the second dielectric film 60 formed on the side wall of the first conductive electrode 40.

Then, a polycrystalline silicon layer with a thickness of about 300 nm is formed on an entire surface of the second silicon oxide film 60 by using the LPCVD process. Thereafter, the polycrystalline silicon layer is patterned to expose a part of the second oxide film 60 which is formed on the first conductive electrode 40. Thus, a second conductive electrode 80 is formed (FIG.1(e)). Then, an inter-layer dielectric film 90 is formed (FIG.1(f)).

Figure 1G:
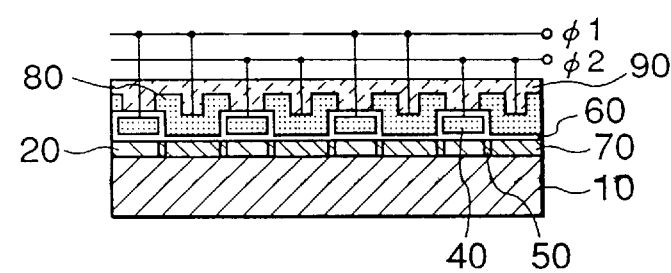

Thereafter, metal wiring are formed on the inter-layer dielectric film 90 supplying the first conductive electrodes 40 and the second conductive electrodes 80 with a two-phase clock signal (FIG.1(g)). Then, a charge coupled device according to this embodiment is obtained.

Figure 6:
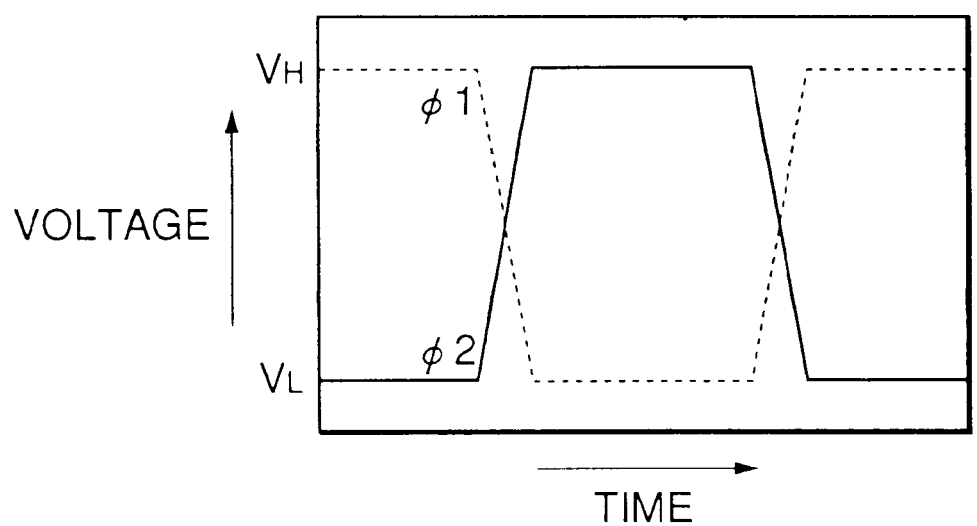
FIG.6 is a diagram showing a clock pulse applied to each electrode of the charge coupled device according to the present invention.

The charge coupled device according to this embodiment is driven by a two clock pluses $\phi_1$ and $\phi_2$. Each phase of the clock pluses $\phi_1$ and $\phi_2$ is different from each other in 180 degrees, as shown in FIG. 6, whereby the signal charges are transferred from the right to the left on the plane of the paper sheet.

In this embodiment, the impurity concentration is $1\times10^{17} cm^3$ at the n-type silicon region 20 formed just below the first charge transfer electrode 40. On the other hand, the impurity concentration is $6\times10^{16} cm^3$ at the n-type silicon region 50 formed below the side wall of the first charge transfer electrode 40, while it is $8\times10^{16} cm^3$ in the n-type silicon region below the depressed section of the second charge transfer electrode 80. That is, the n-type silicon region 50 has the lowest impurity concentration was observed in the region under the second silicon oxide film 60 on the side wall of the first charge transfer electrode 40.

Figure 5A:
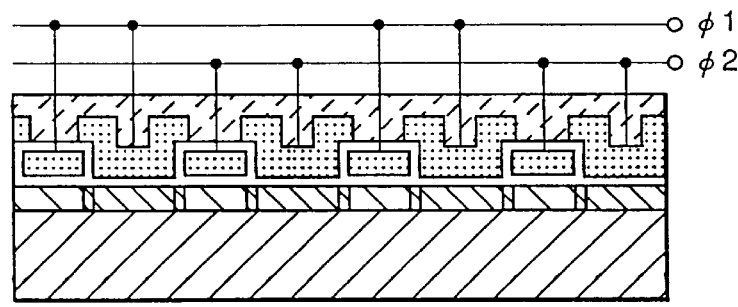
FIG.5(a) is sectional view of the charge coupled device according to the first embodiment of the present invention.
Figure 5B:
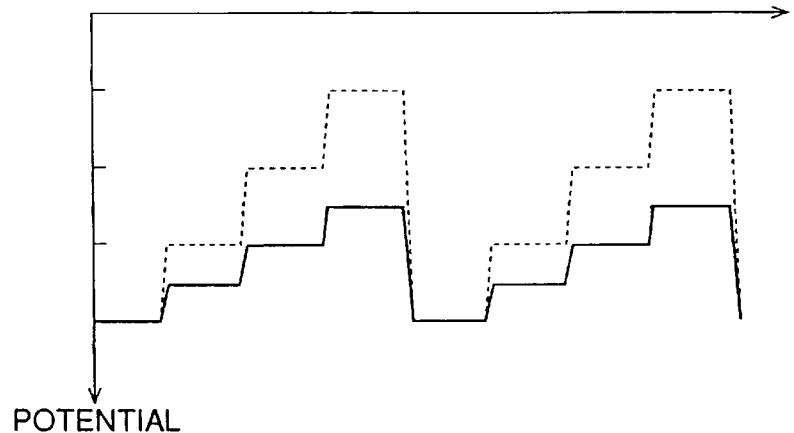
FIG.5(b) is a diagram showing electric potential when the charge coupled device according to the first embodiment of the present invention is driven at a low voltage and a high voltage.

FIG.5(b) is a diagram showing electric potential of the charge coupled device according to the embodiment of the present invention which is shown in FIG.5(a). In the charge coupled device according to the embodiment, since the impurity concentration in the n-type silicon region 50 below the second silicon oxide film 60 is lower than that of the n-type regions 20 and 70 below the first and second conductive electrodes 40 and 80, respectively, the electric potential shows a smooth curve as shown in FIG.5(b). That is, the depression in the electric potential between the electrodes is eliminated even when the driving voltage of the clock pulse is low.

Now, a second embodiment of the present invention will be explained. FIG.2(a)–(g) sequentially shows sectional views in each fabricating step of a charge coupled device with a buried channel two-phase driven two-layer electrode structure according to a second embodiment of the present invention. The charge coupled device according to this embodiment has the same structure as the first invention while it is different form the first embodiment in the impurity concentration of each region.

First, a n-type silicon region 21 with impurity concentration of about $8\times10^{16} cm^3$ is formed into a p-type silicon monocrystalline substrate 11 with impurity concentration of about $1\times10^{15} cm^3$. A depth of the n-type silicon region 21 is about 0.5μm from the surface of the silicon substrate 11. The n-type silicon region 21 is formed by ion implantation technique implanting phosphorus into the p-type silicon substrate 11. Thereafter, a first silicon oxide film 31 with a thickness of about 100 nm is formed on the surface of the n-type silicon region 21 by a thermal oxidation technique (FIG.2(a)).

Then, using the LPCVD process, a polycrystalline silicon layer with a thickness of about 300 nm is formed on an entire surface of the first silicon oxide layer 31, and thereafter, the polycrystalline silicon layer is patterned to form a first conductive electrode 41. Then, p-type impurities (for example, boron) of the conductivity opposite is implanted into the n-type silicon region 21 through the first silicon oxide film 31 using the first conductive electrode 41 as a mask to form an n-type silicon region 51 in the n-type silicon region 21 self-aligning with the first conductive electrode 41 (FIG.2(b)). The ion implantation is performed at a condition of an incident angle of zero. An impurity concentration of the n-type silicon region 51 is about $6\times10^{16} cm^3$.

Subsequently, after the first silicon oxide film 31 is removed by using the first conductive electrode 41 as a mask because the first silicon oxide film 31 was damaged by the previous ion implantation. Then, a second silicon oxide film 61 with a thickness of about 100 nm is formed on the surface of the n-type silicon region 21 and the surface of the first conductive electrode 41 by, for example, reacting $SiH_4$ and $H_2O$ gas with the CVD process (FIG.2(c)).

Figure 2A:
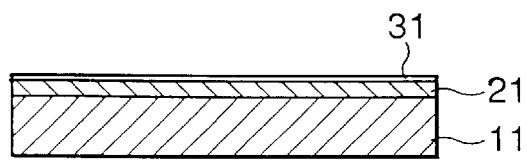
FIGS.2(a)–(g) are sequential sectional views of fabricating steps of a charge coupled device according to a second embodiment of the present invention.
Figure 2B:
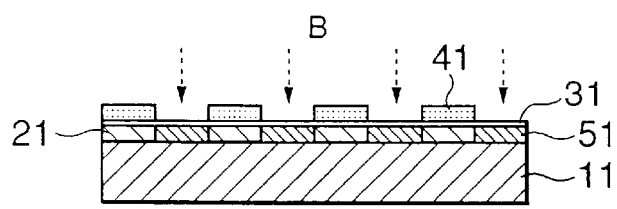
Figure 2C:
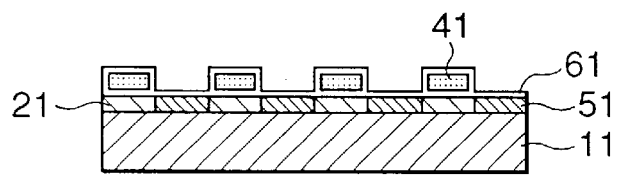
Figure 2D:
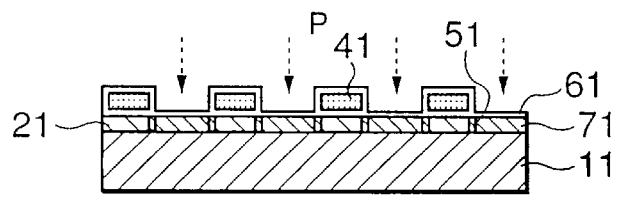
Figure 2E:
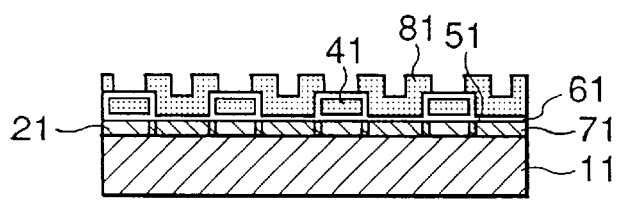
Figure 2F:
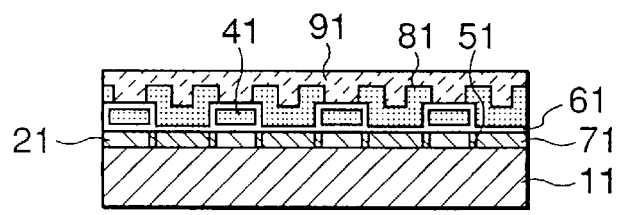

Then, n-type impurities (for example, phosphorus) of the same conductivity as the n-type semiconductor region 21 is implanted into the n-type silicon region 51 through the second silicon oxide film 61 using the first conductive electrode 41 and a part of the second dielectric film 61 formed on the side wall of the first conductive electrode 41 as a mask to form an n-type silicon region 71 in the n-type silicon region 51 self-aligning with the first conductive electrode 41 and the part of the second dielectric film 61 (FIG.2(d)). The ion implantation is performed at a condition of an incident angle of zero. An impurity concentration of the n-type silicon region 71 is about $1\times10^{17} cm^3$.

Apparent form FIG.2(d), the n-type silicon region 51 remains only below the part of the second oxide film 61 formed on the side wall of the first conductive electrode 41.

Then, a polycrystalline silicon layer with a thickness of about 300 nm is formed on an entire surface of the second silicon oxide film 61 by using the LPCVD process. Thereafter, the polycrystalline silicon layer is patterned to expose a part of the second oxide film 61 which is formed on the first conductive electrode 41. Thus, a second conductive electrode 81 is formed (FIG.2(e)). Then, an inter-layer dielectric film 91 is formed (FIG.2(f)).

Figure 2G:
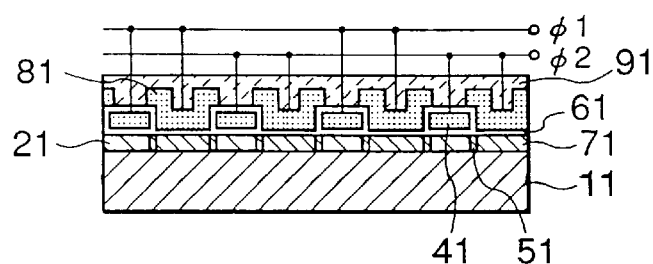
Figure 3A:
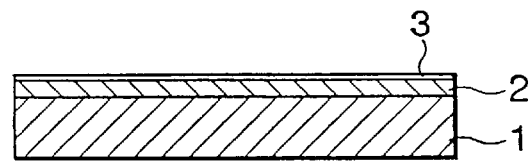
FIGS.3(a)–(g) are sequential sectional views of fabricating steps of a conventional charge coupled device.
Figure 3B:
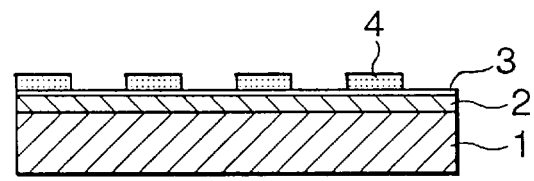
Figure 3C:
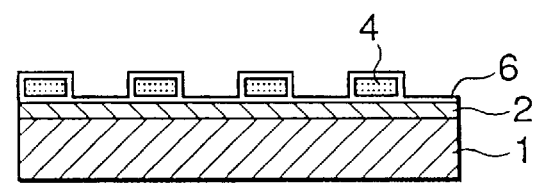
Figure 3D:
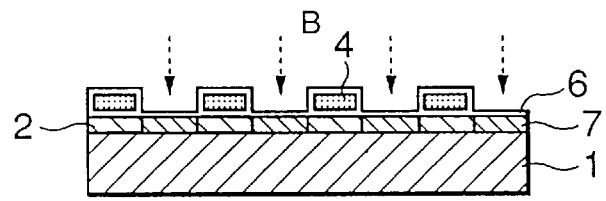
Figure 3E:
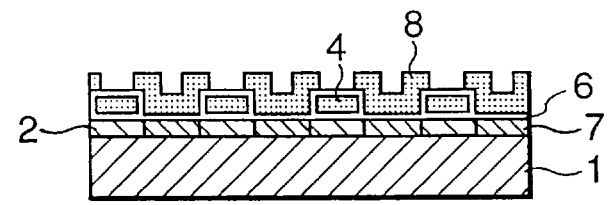
Figure 3F:
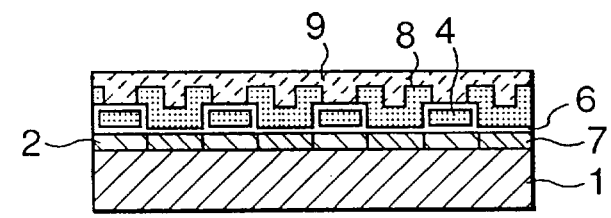
Figure 3G:
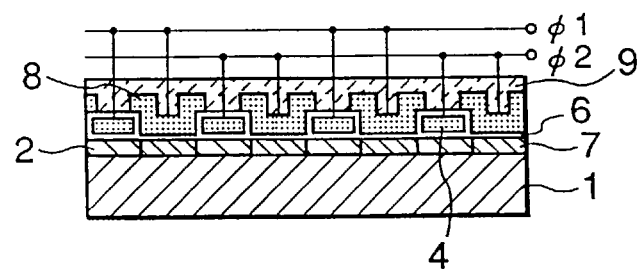
Figure 4A:
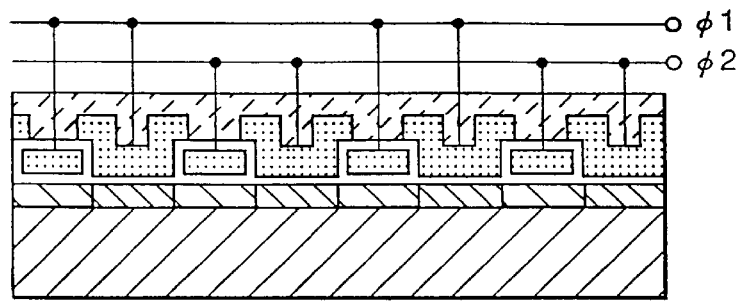
FIG.4(a) is sectional view of the conventional charge coupled device.
Figure 4B:
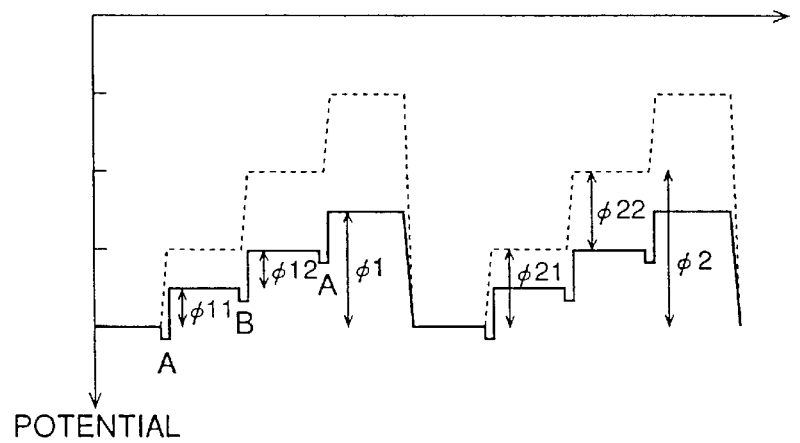
FIG.4(b) is a diagram showing electric potential when the conventional charge coupled device is driven at a low voltage and a high voltage.

Thereafter, metal wiring are formed on the inter-layer dielectric film 91 supplying the first conductive electrodes 41 and the second conductive electrodes 81 with a two-phase clock signal (FIG.2(g)). Then, a charge coupled device according to the second embodiment is obtained.

The charge coupled device according to this embodiment is driven by a two clock pluses $\phi_1$ and $\phi_2$ clock pulse of which differ by 180 degrees from each other, as shown in FIG.6, same as the first embodiment.

In this embodiment, the impurity concentration is $8\times10^{16} cm^3$ at the n-type silicon region 21 formed just below the first charge transfer electrode 41. On the other hand, the impurity concentration is $6\times10^{16} cm^3$ at the n-type silicon region 51 formed below the side wall of the first charge transfer electrode 41, while it is $1\times10^{17}\text{cm}^3$ in the n-type silicon region below the depressed section of the second charge transfer electrode 81. That is, the n-type silicon region 51 has the lowest impurity concentration was observed in the region under the second silicon oxide film 61 on the side wall of the first charge transfer electrode 41. Thus, in this embodiment, the electric potential shows a smooth curve, same as the first embodiment. Accordingly, signal charges are not trapped in the depression even when the drive voltage is lowered, so that smooth transfer is attained.

While both the embodiments described above are described for a charge coupled device having buried channels in a p-type silicon substrate, the present invention is not limited to such arrangement, and it can be applied to a charge coupled device having buried channels formed in a p-type well layer mounted on an n-type silicon substrate to obtain the same advantage.

As described above, according to the present invention, it is possible to suppress depression in the electric potential generated below the gap between the first and second charge transfer electrodes, so that the drive voltage can be reduced without lowering transfer efficiency of signal charges.

Therefore, according to the present invention, signal charges cannot be trapped in depression even when the drive voltage is lowered, so that smooth transfer can be attained. Thus, it is possible to provide a video camera and a digital camera with high image quality and low power consumption by applying the charge coupled device according to the present invention.

What is claimed is:

1. A charge coupled device driven by a two-phase clock constituted of a first and a second clock pulse, comprising:

a semiconductor substrate of a first conductivity type;

a plurality of first and second regions of a second conductivity type formed in said semiconductor substrate, each of said first regions having a first impurity concentration and each of said second regions having a second impurity concentration, wherein said first and second regions are alternately located within said semiconductor substrate;

a plurality of third regions of said second conductivity type formed in said semiconductor substrate, each of said third regions having a third impurity concentration which is lower than each of said first and second impurity concentrations, wherein each third region is located between respective ones of said first and second regions;

a first dielectric film formed on said semiconductor substrate;

a plurality of first transfer electrodes, each of which has side surfaces and a top surface, and is formed on said first dielectric film and positioned over a first region;

a second dielectric film formed on the exposed portions of said first dielectric film and covering said plurality of first transfer electrodes; and a plurality of second transfer electrodes, each of which is formed on said second dielectric film and positioned over a second region.

2. The charge coupled device as claimed in claim 1, wherein said first impurity concentration is lower than said second impurity concentration.

3. The charge coupled device as claimed in claim 2, wherein said third impurity concentration is around $6\times10^{16}\text{cm}^3$.

4. The charge coupled device as claimed in claim 3, wherein said first impurity concentration is around $8\times10^{16}\text{cm}^3$, said second impurity concentration being around $1\times10^{17}\text{cm}^3$.

5. The charge coupled device as claimed in claim 1, wherein said first clock pulse corresponds to a first phase, said second clock pulse corresponds to a second phase, said first and second phases are different from each other by 180 degrees.

6. The charge coupled device as claimed in claim 1, wherein said plurality of first transfer electrodes is divided alternately into a first group, supplied with said first clock pulse, and a second group supplied with said second clock pulse, and wherein said plurality of second transfer electrodes is divided alternately into a third group, supplied with said first clock pulse, and a fourth group supplied with said second clock pulse.

7. The charge coupled device as claimed in claim 1, wherein said charge coupled device comprises a horizontal charge transfer section of an image capture device.

* * * * *